(12) United States Patent
Maung et al.

(10) Patent No.: US 11,356,236 B2
(45) Date of Patent: Jun. 7, 2022

(54) BIDIRECTIONAL RE-DRIVER FOR HALF-DUPLEX INTERFACES

(71) Applicant: TEXAS INSTRUMENTS INCORPORATED, Dallas, TX (US)

(72) Inventors: Win Naing Maung, Plano, TX (US); Charles Michael Campbell, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 278 days.

(21) Appl. No.: 16/827,415

(22) Filed: Mar. 23, 2020

(65) Prior Publication Data

US 2020/0366456 A1 Nov. 19, 2020

Related U.S. Application Data

(63) Continuation of application No. 62/848,622, filed on May 16, 2019.

(51) Int. Cl.
| | |
|---|---|
| *H03M 1/12* | (2006.01) |
| *H04L 5/16* | (2006.01) |
| *H04L 12/40* | (2006.01) |
| *H04L 5/14* | (2006.01) |
| *G06F 13/40* | (2006.01) |

(52) U.S. Cl.
CPC ............. *H04L 5/16* (2013.01); *H03M 1/12* (2013.01); *H03M 1/1245* (2013.01); *H03M 1/1295* (2013.01); *H04L 5/1461* (2013.01); *H04L 12/40032* (2013.01); *G06F 13/4004* (2013.01)

(58) Field of Classification Search
CPC .... H03M 1/12; H03M 1/1245; H03M 1/1295; G06F 13/404; H04L 5/16; H04L 5/1461
USPC ........................................................ 341/155
See application file for complete search history.

(56) References Cited

U.S. PATENT DOCUMENTS

| | | | | |
|---|---|---|---|---|
| 10,048,302 | B2 * | 8/2018 | Lawlis | ............... G01R 29/0878 |
| 11,165,613 | B2 * | 11/2021 | Zerbe | ................ H04L 25/03343 |
| 2020/0110645 | A1 * | 4/2020 | Rajgopal | ............. G06F 12/0246 |

* cited by examiner

*Primary Examiner* — Peguy Jean Pierre
(74) *Attorney, Agent, or Firm* — Mark A. Valetti; Charles A. Brill; Frank D. Cimino

(57) ABSTRACT

Circuit including a first port to couple to a first device; a second port to couple to a second device; a first channel having an input coupled to first port and an output coupled to second port, the first channel to re-drive a signal and output re-driven signal; a second channel having an input coupled to second port and an output coupled to first port, the second channel to re-drive a signal and output re-driven signal; and a controller to: enable first channel and disable second channel responsive to detecting a signal edge at first port; enable second channel and disable first channel responsive to detecting a signal edge at second port; sample impedance at first port if signal received at first port is de-asserted while first channel is enabled; and sample impedance at second port if signal received at second port is de-asserted while second channel is enabled.

18 Claims, 5 Drawing Sheets

BIDIRECTIONAL RE-DRIVER FOR HALF-DUPLEX INTERFACES

CROSS-REFERENCE TO RELATED APPLICATIONS

The present application claims priority to U.S. Provisional Patent Application No. 62/848,622, which was filed May 16, 2019, is titled "Bidirectional Autonomous Level Shifter For Half Duplex SPMI Interface," and is hereby incorporated herein by reference in its entirety.

SUMMARY

In accordance with at least one example of the disclosure, a re-driver circuit includes a first port configured to couple to a first device by a first bus and a second port configured to couple to a second device by a second bus. The re-driver circuit also includes a first communication channel having an input coupled to the first port and an output coupled to the second port, the first communication channel configured to re-drive an input signal and output the re-driven input signal; a second communication channel having an input coupled to the second port and an output coupled to the first port, the second communication channel configured to re-drive an input signal and output the re-driven input signal; and a controller. The controller is configured to enable the first communication channel and disable the second communication channel in response to detecting a first signal edge at the first port; enable the second communication channel and disable the first communication channel in response to detecting a first signal edge at the second port; sample an impedance at the first port in response to the input signal received at the first port being de-asserted while the first communication channel is enabled; and sample an impedance at the second port in response to the input signal received at the second port being de-asserted while the second communication channel is enabled.

In accordance with another example of the disclosure, a re-driver circuit includes a first port configured to couple to a first device by a first clock bus, a second port configured to couple to a second device by a second clock bus, a third port configured to couple to the first device by a first data bus, a fourth port configured to couple to the second device by a second data bus, a first communication channel configured to re-drive an input clock signal received from the first port to the second port as an output clock signal, a second communication channel configured to re-drive an input clock signal received from the second port to the first port as an output clock signal, a third communication channel configured to re-drive an input data signal received from the third port to the fourth port as an output data signal, a fourth communication channel configured to re-drive an input data signal received from the fourth port to the third port as an output data signal, and a controller. The controller is configured to enable the first communication channel and disable the second communication channel in response to detecting a start of clock signal edge at the first port, enable the second communication channel and disable the first communication channel in response to detecting a start of clock signal edge at the second port, enable the third channel and disable the fourth channel in response to detecting a start of data signal edge at the third port, enable the fourth communication channel and disable the third communication channel in response to detecting a start of data signal edge at the fourth port, sample an impedance at the first port in response to the input clock signal received at the first port being de-asserted while the first communication channel is enabled, sample an impedance at the second port in response to the input clock signal received at the second port being de-asserted while the second communication channel is enabled, sample an impedance at the third port in response to the input data signal received at the third port being de-asserted while the third communication channel is enabled, and sample an impedance at the fourth port in response to the input data signal received at the fourth port being de-asserted while the fourth communication channel is enabled.

In accordance with yet another example of the disclosure, a method includes detecting a first signal edge at a first port configured to couple to a first device by a first bus, or detecting a first signal edge at a second port configured to couple to a second device by a second bus. The method also includes, in response to detecting the first signal edge at the first port, enabling a first communication channel configured to re-drive an input signal received from the first port to a second port as an output signal and disabling a second communication channel configured to re-drive an input signal received from the second port to the first port as an output signal. The method also includes, in response to detecting the first signal edge at the second port, enabling the second communication channel and disabling the first communication channel. The method further includes sampling an impedance at the first port in response to the input signal received at the first port being de-asserted while the first communication channel is enabled, and sampling an impedance at the second port in response to the input signal received at the second port being de-asserted while the second communication channel is enabled.

BRIEF DESCRIPTION OF THE DRAWINGS

For a detailed description of various examples, reference will now be made to the accompanying drawings in which.

DETAILED DESCRIPTION

Figure 1:
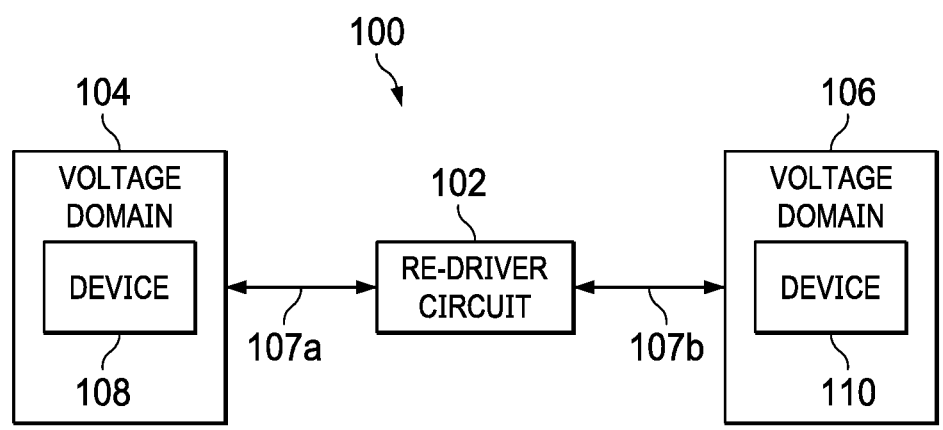
FIG. 1 shows a block diagram of a system in accordance with various examples.

Communication interfaces are prevalent in modern electronics. Some communication interfaces are unidirectional (e.g., data flows in only one direction), while other communication interfaces are bidirectional (e.g., data flows in both directions). A half-duplex communication system utilizes a bidirectional communication interface, in which devices can communicate with each other, but not simultaneously. For example, communication occurs in only one direction at a time.

Computers and other electronic devices commonly use serial communication interfaces to provide for transfer of data between connected devices. The universal serial bus (USB) interface is one of a variety of serial buses used to interface electronic devices. The system power management interface (SPMI) is another serial bus used to interface electronic devices. SMPI is a bidirectional, two-wire serial bus interface for example to control voltage(s) supplied to processor(s) and power management of auxiliary components coupled thereto. Other serial interfaces are also within the scope of this disclosure. Regardless of the particular type of interface, electronic devices that communicate by way of such interfaces include, for example, computers, smartphones, video game consoles, and other computing devices. Peripheral devices also communicate by way of such interfaces and include, for example, flash drives, printers, keyboards, smartphones, cameras, tablets, and various other devices.

Regardless of the particular type of device(s) communicating by way of an bidirectional, half-duplex, serial communication interface, in some examples input/output (I/O) voltage levels differ from one device type to another device type. For example, as process technology becomes smaller for processors (e.g., a system on a chip (SoC)), the I/O voltage limit for the processor also decreases. As one example, a processor that uses 5 nm process technology may have an I/O voltage limit of approximately 1.2 V, while a processor that uses 3 nm process technology may have an I/O voltage limit of approximately 1.0 V. Further, in some examples, processors interface with higher-voltage interfaces such as SPMI (e.g., an I/O voltage limit of 1.8 V) or USB (e.g., an I/O voltage limit of 3.3 V). In order for a device in a first voltage domain (e.g., a processor with an I/O voltage limit of approximately 1.2 V) to communicate with a device in a second voltage domain (e.g., a SPMI device with an I/O voltage limit of 1.8 V), level shifting is utilized to shift voltage levels of signals from one voltage domain to the other voltage domain. Additionally, communication signals benefit from being re-driven, or received and re-transmitted, by a re-driver circuit. For example, re-driving a signal by a re-driver circuit between devices increases the tolerable range between devices, while isolating two sides of a communication bus, which prevents bus capacitance from one side of the re-driver circuit from loading the bus on the other side of the re-driver circuit. While, in some examples, a dedicated hub or bridge device accomplishes such level shifting and re-driving of signals, dedicated hubs are space-consuming and costly to implement. For example, a dedicated hub or bridge device may actively participate in a bus arbitration process and emulate both a slave-facing-master device as well as a master-facing-slave device. Active participation in bus arbitration and such master/slave emulation involves more complex de-packetizing and re-packetizing of payloads, which increases overall device complexity.

Examples of this disclosure include a re-driver circuit between two voltage domains that functions to level shift signal voltages to facilitate communications between devices in different voltage domains and/or to re-drive those communication signals between devices. In particular, the re-driver circuit facilitates half-duplex communications, where in some examples level shifting occurs in both directions regardless of the direction of communication traffic. Preferably, the re-driver circuit is configured to detect a first signal edge that indicates the start of a signal transmission (e.g., a rising edge of a signal carried by a clock and/or data bus) from a device in one of the voltage domains. However, the re-driver circuit may use other techniques that indicate the start of a signal transmission. If the first signal edge is detected from a first of the two voltage domains (e.g., on a first bus coupled to a first port of the re-driver circuit), the re-driver circuit is configured to enable a first communication channel from the first voltage domain to a second of the two voltage domains. If the first signal edge is detected from the second voltage domain (e.g., on a second bus coupled to a second port of the re-driver circuit), the re-driver circuit is configured to enable a second communication channel from the second voltage domain to the first voltage domain. As will be explained further below, the communication channels facilitate level shifting of the signal voltage and/or re-driving of the signal from one voltage domain to the other. For example, in some cases, the I/O voltage limit for each voltage domain is approximately the same and thus the re-driver circuit functions to drive signals (e.g., clock and/or data signals) between the voltage domains but does not necessarily perform level shifting of the signals between the voltage domains.

The re-driver circuit is also configured to sample an impedance of the bus coupled to the device that is providing communication signals to the re-driver circuit (e.g., that the re-driver circuit level shifts and/or re-drives to a device in the other voltage domain). The re-driver circuit samples the impedance of the bus to determine whether a device is still providing communication signals, or whether a device has ceased to provide communication signals, in which case the bus coupled to that device is in a high-impedance state. In one example, the re-driver circuit samples the impedance of the bus by injecting a current (e.g., by controlling a current source) into the bus—for example, when the clock and/or data signal on the bus transitions to a low state—and monitoring a voltage on the bus in response to the injected current. In an example, a pull-down resistor is coupled to the bus. If the bus is still being driven, the injected current will have a relatively small impact on the voltage of the bus. However, if the bus is not being driven (e.g., is in a high-impedance state), the injected current will have a larger impact on the voltage of the bus due to the pull-down resistor, which the re-driver circuit detects (e.g., using a comparator). The value of the pull-down resistor and the amount of current injected are selected such that the voltage across the pull-down resistor is detected when the bus is in a high-impedance state, but also that such voltage is not great enough to be interpreted as a high or asserted signal on the bus. When a high-impedance state is detected on a bus, the communication channel that was level shifting and/or re-driving the signal from that bus is disabled, and the re-driver circuit again monitors for a first signal edge, as described above. In this way, the re-driver circuit monitors both sides of a bus and detects the direction of the communication signal to perform level shifting and/or re-driving of the communication signal in the direction of data transmission.

FIG. 1 shows a block diagram of a system 100 in accordance with examples of this disclosure. The system 100 shows a re-driver circuit 102, a first voltage domain 104, and a second voltage domain 106. Each voltage domain 104, 106 includes one or more devices 108, 110, respectively, that communicate with device(s) in the other voltage domain. Thus, the re-driver circuit 102 couples to one or more devices 108 in the first voltage domain 104 by a first bus 107a and to one or more devices 110 in the second voltage domain 106 by a second bus 107b, and facilitates communication between the devices 108, 110 in the first and second voltage domains 104, 106. Although the buses 107a, 107b are referred to separately, in some examples, the buses 107a, 107b are portions of the same bus, such as a clock bus or a data bus, that couples a device 108 in the first voltage domain 104 to a device 110 in the second voltage domain 106. In other examples, the re-driver circuit 102 is coupled to devices 108, 110 in each voltage domain 104, 106 by more than one bus. In the specific example of an SPMI interface, which utilizes a two-wire bus (e.g., a clock signal bus and a data signal bus), the re-driver circuit 102 is coupled to devices 108, 110 in each voltage domain 104, 106 by two buses. As explained above, the re-driver circuit 102 enables bidirectional communication, while facilitating half-duplex communication by detecting the start of a signal transmission from either the first voltage domain 104 or the second voltage domain 106 (preferably by detecting a first signal edge of an input signal).

As explained above, in some examples, device(s) 108 in the first voltage domain 104 operates at a first I/O voltage level, while device(s) 110 in the second voltage domain 106 operates at a second I/O voltage level different than the first I/O voltage level. In these examples, the re-driver circuit 102 both level shifts and re-drives the signal originating from the voltage domain 104, 106 from which the first signal edge was first detected. In other examples, devices 108, 110 in the first and second voltage domains 104, 106 operate around the same I/O voltage level, and thus the re-driver circuit 102 re-drives signals from the voltage domain 104, 106 from which the first signal edge was first detected, but does not necessarily perform level shifting of signals between the voltage domains 104, 106. In some examples, even in the absence of voltage shifting, re-driving a signal allows a greater capacitive load to be driven than if the re-driver circuit 102 were not present between the devices 108, 110.

As will be explained in further detail below, the re-driver circuit 102 is also configured to sample an impedance of the bus 107a, 107b coupled to the device that is providing communication signals to the re-driver circuit 102. The re-driver circuit 102 samples the impedance of the bus 107a, 107b to determine whether a device 108, 110 is still providing communication signals, or whether a device 108, 110 has ceased to provide communication signals, in which case the bus 107a, 107b coupled to that device 108, 110 is in a high-impedance state (e.g., an idle state). When a high-impedance state is detected on a bus 107a, 107b, the re-driver circuit 102 disables the communication channel that was level shifting and/or re-driving the signal from that bus 107a, 107b, and the re-driver circuit 102 again monitors for a first signal edge, as described above. In this way, the re-driver circuit monitors both sides of a bus 107a, 107b and detects the direction of the communication signal to perform level shifting and/or re-driving of the communication signal in the direction of data transmission.

Figure 2:
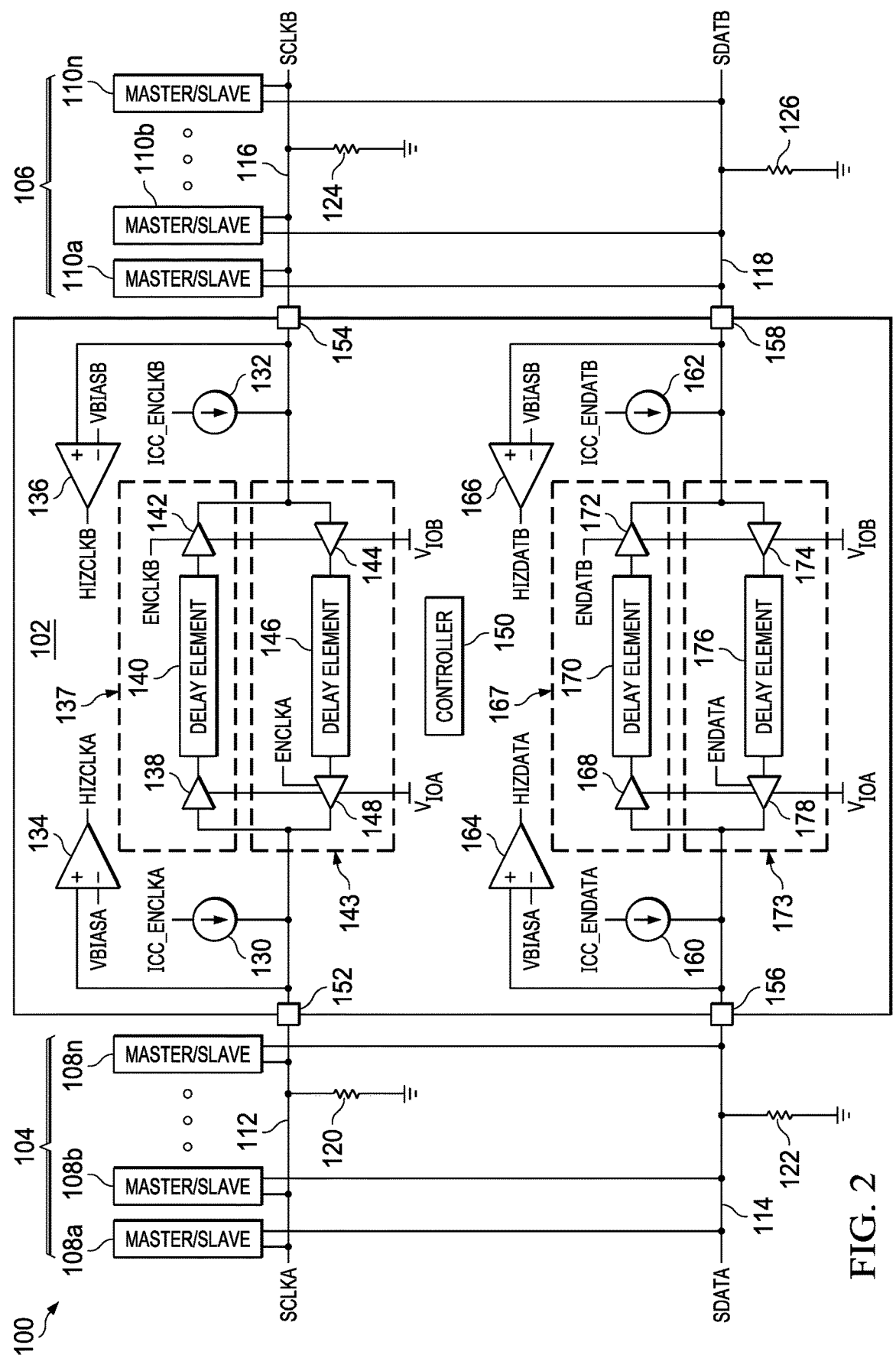
FIG. 2 shows a schematic diagram of a re-driver circuit in accordance with various examples.

FIG. 2 shows the system 100 described above with respect to FIG. 1, including a schematic diagram of the re-driver circuit 102 in further detail. In the example of FIG. 2, the re-driver circuit 102 is utilized in an example SPMI interface and is shown as coupled to multiple devices 108a-108n in the first voltage domain 104 and to multiple devices 110a-110n in the second voltage domain 106. In other examples, there is only a single device 108 in the first voltage domain 104 and/or a single device 110 in the second voltage domain 106. In examples, the devices 108, 110 are configured to function as either a master or a slave for purposes of implementing a communication protocol between devices 108, 110. Further, in the example of FIG. 2, the re-driver circuit 102 couples to the devices 108a-108n by a first clock bus 112 and a first data bus 114 (e.g., of a two-wire SPMI interface). Similarly, the re-driver circuit 102 couples to the devices 110a-110n by a second clock bus 116 and a second data bus 118. Pull-down resistors 120, 122, 124, 126 are coupled to the buses 112, 114, 116, 118, respectively. The pull-down resistors 120, 122, 124, 126 are also coupled to a ground node.

The re-driver circuit 102 includes a controller 150, which is configured to perform the various functionalities described herein. In some examples, the controller 150 is an integrated circuit or a processing device. The scope of this disclosure is not limited by the particular form of the controller 150. The controller 150 functionality is described more fully below.

The re-driver circuit 102 includes a first port 152 configured to couple to the first clock bus 112; a second port 154 configured to couple to the second clock bus 116; a third port 156 configured to couple to the first data bus 114; and a fourth port 158 configured to couple to the second data bus 118. Through the ports 152, 154, 156, 158, the re-driver circuit 102 is able to send communication signals to, and receive communication signals from, the various devices 108, 110 in the first and second voltage domains 104, 106, respectively. The controller 150 is coupled to each of the ports 152, 154, 156, 158 and to various other elements of the re-driver circuit 102 as described further below.

The re-driver circuit 102 includes a first communication channel 137 that includes a receiver 138, a delay element 140, and a driver 142. The first communication channel 137 is configured to re-drive an input signal received from the first port 152 as an output signal to the second port 154. In the specific example of FIG. 2, the input signal to, and the output signal from, the first communication channel 137 are clock signals. In some examples, the first communication channel 137 is also configured to level shift the input clock signal received from the first port 152 from the first voltage domain 104 having a first I/O voltage limit ($V_{IOA}$) to the second voltage domain 106 having a second I/O voltage limit ($V_{IOB}$).

The re-driver circuit 102 includes a second communication channel 143 that includes a receiver 144, a delay element 146, and a driver 148. The second communication channel 143 is configured to re-drive an input signal received from the second port 154 as an output signal to the first port 152. In the specific example of FIG. 2, the input signal to, and the output signal from, the second communication channel 143 are clock signals. In some examples, the second communication channel 143 is also configured to level shift the input clock signal received from the second port 154 from the second voltage domain 106 ($V_{IOB}$) to the first voltage domain 104 ($V_{IOA}$).

The re-driver circuit 102 also includes third and fourth communication channels 167 (including receiver 168, delay element 170, and driver 172), 173 (including receiver 174, delay element 176, and driver 178), which are similar in function to the first and second communication channels 137, 143, described above, except coupled to the third port 156 and the fourth port 158 rather than the first port 152 and the second port 154. In the specific example of FIG. 2, the input signal to, and the output signal from, the third and fourth communication channels 167, 173 are data signals. In some examples, the third communication channel 167 is also configured to level shift the input data signal received from the third port 156 from the first voltage domain 104 ($V_{IOA}$) to the second voltage domain 106 ($V_{IOB}$). Similarly, the fourth communication channel 173 is also configured to level shift the input data signal received from the fourth port 158 from the second voltage domain 106 ($V_{IOB}$) to the first voltage domain 104 ($V_{IOA}$).

Each of the receivers 138, 144, 168, 174 functions in a like manner. In particular, the receiver 138 is configured to receive an input signal from the first port 152. Similarly, the receiver 144 is configured to receive an input signal from the second port 154; the receiver 168 is configured to receive an input signal from the third port 156; and the receiver 174 is configured to receive an input signal from the fourth port 158. The receivers 138, 144, 168, 174 produce a signal based on the received input signal and provide the produced signal to the respective delay element 140, 146, 170, 176. In one example, the receivers 138, 144, 168, 174 are comparators that satisfy specific threshold levels defined by the SPMI specification.

The delay elements 140, 146, 170, 176 introduce a delay to each of the communication channels 137, 143, 167, 173 to ensure that the control path (e.g., functionality performed by controller 150) is faster than the data path (e.g., through the communication channels 137, 143, 167, 173) so that the controller 150 is able to enable the proper one of the communication channels 137, 143, 167, 173 while avoiding the loss of signal data between the devices 108, 110 in the voltage domains 104, 106. The purpose of the introduced delay will be explained in further detail below. Each delay element 140, 146, 170, 176 provides its delayed signal to the respective driver 142, 148, 172, 178. In one example, the delay elements 140, 146, 170, 176 are inverter chains, which may be programmable by adjusting the number of inverter stages as well as an RC load of the inverter stages.

The drivers 142, 148, 172, 178 each drives an output signal to their associated port 154, 152, 158, 156, respectively, and in some cases performs level shifting on the signal received from its respective delay element 140, 146, 170, 176. For example, the drivers 142, 172 level shift the signals from the delay elements 140, 170 from the first voltage domain 104 to the second voltage domain 106. Similarly, the drivers 148, 178 level shift the signals from the delay elements 146, 176 from the second voltage domain 106 to the first voltage domain 104. In an example, an enable signal may be provided to one or more of the following: driver 142 (ENCLKB), 148 (ENCLKA), 172 (ENDATB), 178 (ENDATA). When an enable signal is provided, it enables the corresponding driver 142, 148, 172, 178 (and thus the respective communication channel 137, 143, 167, 173). In this way, each of the communication channels 137, 143, 167, 173 is configured to re-drive signals from one voltage domain 104, 106 to the other, as well as level shift those signals from the first voltage domain 104 to the second voltage domain 106 or vice versa, facilitating bidirectional communication between devices 108, 110. Further, and as will be explained in further detail below, only one of the first communication channel 137 and the second communication channel 143 is enabled at a time; similarly, only one of the third communication channel 167 and the fourth communication channel 173 is enabled at a time. Thus, the re-driver circuit 102 also facilitates half-duplex communication between devices 108, 110.

The controller 150 is configured to receive certain signals from the remainder of the re-driver circuit 102 and, based at least in part on those received signals, to control various aspects of the re-driver circuit 102. For example, the controller receives an indication of whether a signal received at one of the ports 152, 154, 156, 158 is asserted (e.g., from a comparator coupled to the port, described further below); an indication of whether a signal received at one of the ports 152, 154, 156, 158 is de-asserted (e.g., from another comparator coupled to the port, described further below); and/or an indication of whether a bus 112, 116, 114, 118 coupled to one of the ports 152, 154, 156, 158 is in a high-impedance state (e.g., from one of the comparators 134, 136, 164, 166, described further below). Based on the signals received by the controller 150, the controller 150 is configured to enable or disable the various communication channels 137, 143, 167, 173 and to control the various current sources 130, 132, 160, 162, which are also described further below.

The controller 150 of the re-driver circuit 102 is configured to detect a first signal edge that indicates the start of a signal transmission on the buses 112, 114, 116, 118. Although not shown for simplicity, in one example, a comparator is coupled to each of the ports 152, 154, 156, 158. These comparators are configured to compare a voltage at the ports 152, 154, 156, 158 with a reference voltage. In an example, the reference voltage is set at a level above which indicates that a signal is asserted for the particular voltage domain 104, 106. For example, the reference voltage is a value slightly less (e.g., within 10 percent) than the I/O voltage limit for the voltage domain 104, 106 to which the port 152, 154, 156, 158 is configured to couple.

For example, a comparator coupled to the first or third ports 152, 156 compares those voltages to a reference voltage (VBIASA) that is slightly less than the I/O voltage limit for the first voltage domain 104, such that an output of a comparator coupled to the first or third ports 152, 156 is asserted when a received signal voltage is indicative of an asserted signal for the first voltage domain 104 (e.g., which would correspond to a rising edge). In the specific example where one voltage domain 104 corresponds to an SPMI interface, which has an I/O voltage limit of 1.8 V, the comparator compares the voltage of the signal received at the ports 152, 156 to a reference voltage of approximately 1.62 V (e.g., 10 percent less than 1.8 V). Similarly, a comparator coupled to the second or fourth ports 154, 158 compares these voltages to a reference voltage (VBIASB) that is slightly less than the I/O voltage limit for the second voltage domain 106, such that an output of a comparator coupled to the second or forth ports 154, 158 is asserted when a received signal voltage is indicative of an asserted signal for the second voltage domain 106 (e.g., which would correspond to a rising edge). In an example where the other voltage domain 106 corresponds to a processor/SoC interface that has an I/O voltage limit of 1.2 V, the comparator compares the voltage of the signal received at the ports 154, 158 to a reference voltage of approximately 1.08 V (e.g., 10 percent less than 1.2 V). In some examples, the clock and data signals may be asserted at different voltages, and thus their reference voltages are different as well. However, for the sake of simplicity of explanation, it is assumed that both clock and data signals from one of the voltage domains 104, 106 are asserted at approximately the same voltage.

The controller 150 of the re-driver circuit 102 is also configured to detect when a signal received from the buses 112, 114, 116, 118 is de-asserted. Again, while not shown for simplicity, in one example, additional comparators are coupled to each of the ports 152, 154, 156, 158. These comparators are configured to compare a voltage at the ports 152, 154, 156, 158 with a reference voltage, which is set at a level below which indicates that a signal is de-asserted. For example, the reference voltage is a value slightly more (e.g., 0.1 V) than a ground node voltage. The outputs of these comparators are asserted when a received signal voltage is indicative of a de-asserted signal, while the outputs of these comparators are de-asserted when a received signal voltage is indicative of an asserted signal.

In addition to detecting asserted signals (or a rising edge) and de-asserted signals (or a falling edge) at the ports 152, 154, 156, 158, the controller 150 is also configured to sample an impedance at the various ports 152, 154, 156, 158. In particular, and as will be explained in further detail below, the controller 150 is configured to sample the impedance at the various ports 152, 154, 156, 158 in response to a signal at one of the ports 152, 154, 156, 158 being de-asserted while that port's corresponding channel is enabled. For example, if the first communication channel 137 is enabled, then the controller 150 is configured to sample the impedance at the first port 152 in response to detecting that the input signal to the first port 152 (e.g., a clock signal) is de-asserted. The controller 150 functions similarly for the other ports 154, 156, 158 and their corresponding communication channels 143, 167, 173, respectively.

The controller 150 is configured to sample the impedance at the first port 152 as described above, for example, to detect a high-impedance state of the first clock bus 112 coupled to the first port 152, which indicates that a device 108 coupled to the first clock bus 112 is no longer driving the first clock bus 112. In one example, a current source 130 is coupled to the first port 152. The controller 150 is configured to control the current source 130, for example to inject a current to the first port 152. In other examples, the amount of current injected is also controllable by the controller 150. A comparator 134 includes a non-inverting terminal that is coupled to the first port 152 and an inverting terminal that is coupled to a reference voltage source (the value of which is given by VBIASA).

For example, when a device 108 coupled to the first clock bus 112 is driving the first clock bus 112, the impedance seen at the first port 152 is the impedance of the device 108 driver, which is relatively low (e.g., around 50 ohms). However, when the device 108 is not driving the first clock bus 112, the device 108 driver is in a high-impedance state, and thus the impedance seen at the first port 152 is approximately the resistance of the pull-down resistor 120, which may have a minimum value of around 125 kohms, for example. Thus, if the controller 150 causes the current source 130 to inject a current (e.g., around 2 uA) to the first port 152 when the device 108 is driving the first clock bus 112, the voltage dropped across the pull-down resistor 120 is relatively small (e.g., below VBIASA), since the impedance of the device 108 driver is much lower than the impedance of the pull-down resistor 120. As a result, the comparator 134 output is not asserted. However, if the controller 150 causes the current source 130 to inject current to the first port 152 when the device 108 is not driving the first clock bus 112, the voltage dropped across the pull-down resistor is larger (e.g., above VBIASA) since the device 108 driver is itself now in a high-impedance state. As a result, the comparator 134 output is asserted, indicating the first clock bus 112 is in a high-impedance state (e.g., an idle state). The particular values of the pull-down resistor 120 resistance, the current injected by the current source 130, and the voltage VBIASA are exemplary, and may differ from those discussed above while still achieving the described functionality for detecting a high-impedance bus state.

In an example, the controller 150 is also configured to control the value of VBIASA. As explained above, the pull-down resistor 120 is coupled to the first clock bus 112 and to a ground node. Thus, when the first clock bus 112 is not being driven by a device 108 (e.g., is in a high-impedance state) and a current is injected to the first port 152 by the current source 130, a voltage is dropped across the pull-down resistor 120. However, when the first clock bus 112 is being driven by a device 108, injecting current to the first port 152 has relatively little impact on the first clock bus 112 voltage. As explained above, the value of the pull-down resistor 120 and the amount of current injected by the current source 130 are selected such that the voltage across the pull-down resistor 120 is detected when the first clock bus 112 is in a high-impedance state, but also that such voltage is not great enough to be interpreted as a high or asserted signal on the first clock bus 112. In an example, the controller 150 sets the value of VBIASA such that the voltage across the resistor 120 in response to injecting current by the current source 130 when the first clock bus 112 is in a high-impedance state causes the comparator 134 to assert its output. However, the value of VBIASA is also set such that a voltage increase on the first clock bus 112 in response to injecting current by the current source 130 when the first clock bus 112 is driven by a device 108 does not cause the comparator 134 to assert its output. The current sources 132, 160, 162 and the comparators 136, 164, 166 function with respect to the ports 154, 156, 158 in a manner similar to the current source 130 and the comparator 134 described above with respect to the first port 152.

Figure 3:
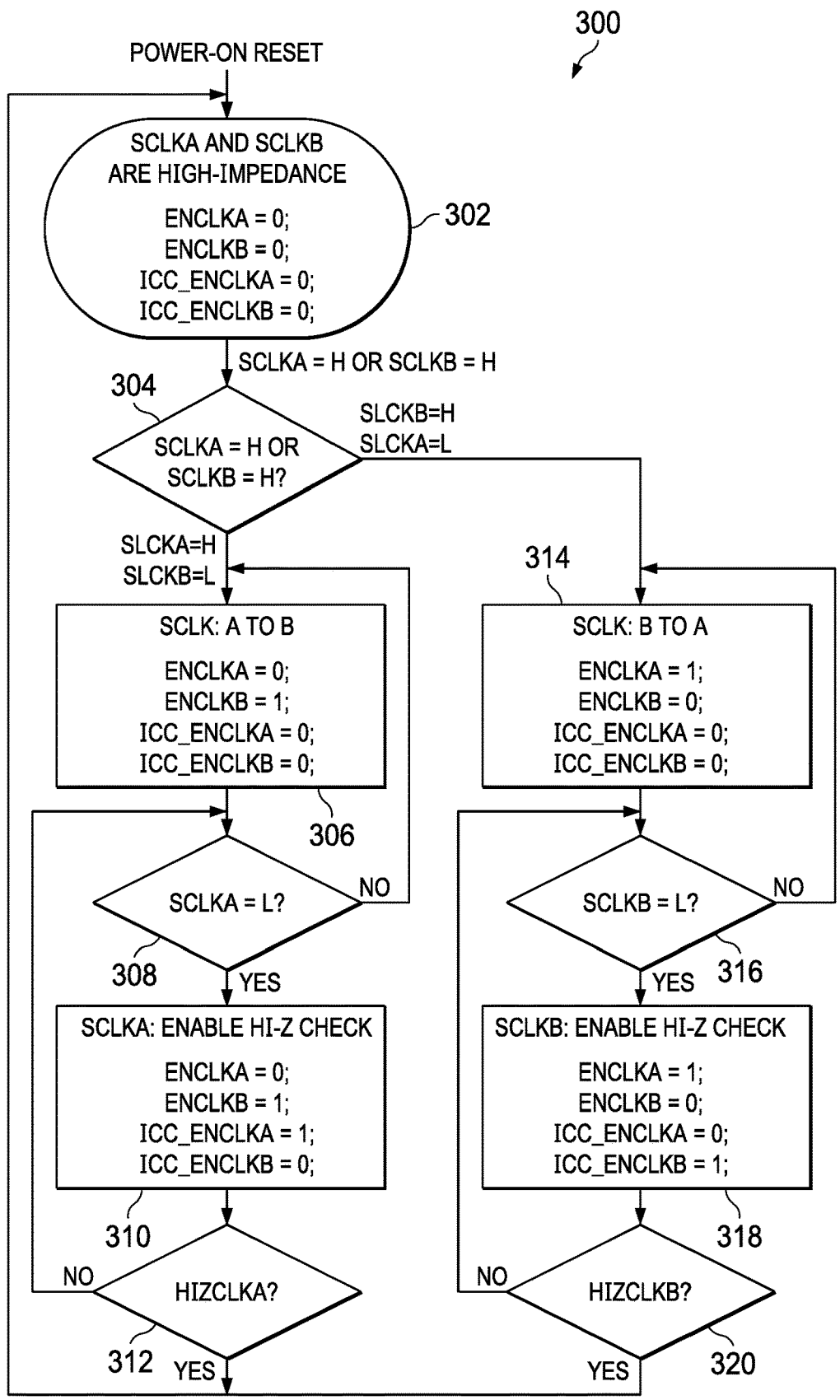
FIG. 3 shows a state diagram for the re-driver circuit of FIG. 2 in accordance with various examples.
Figure 4:
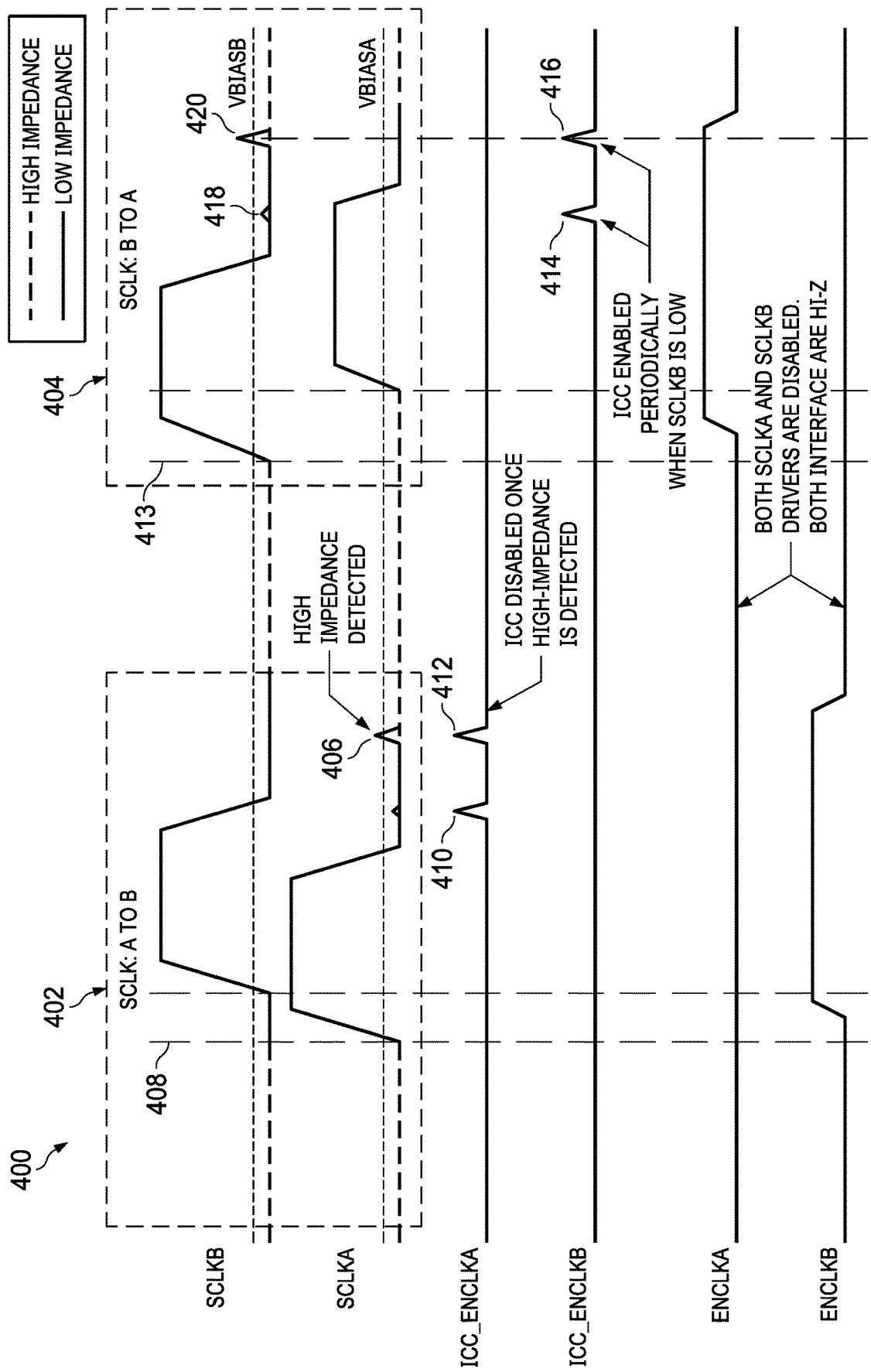
FIG. 4 shows a timing diagram that demonstrates the operation of the re-driver circuit of FIG. 2 in accordance with various examples.
Figure 5:
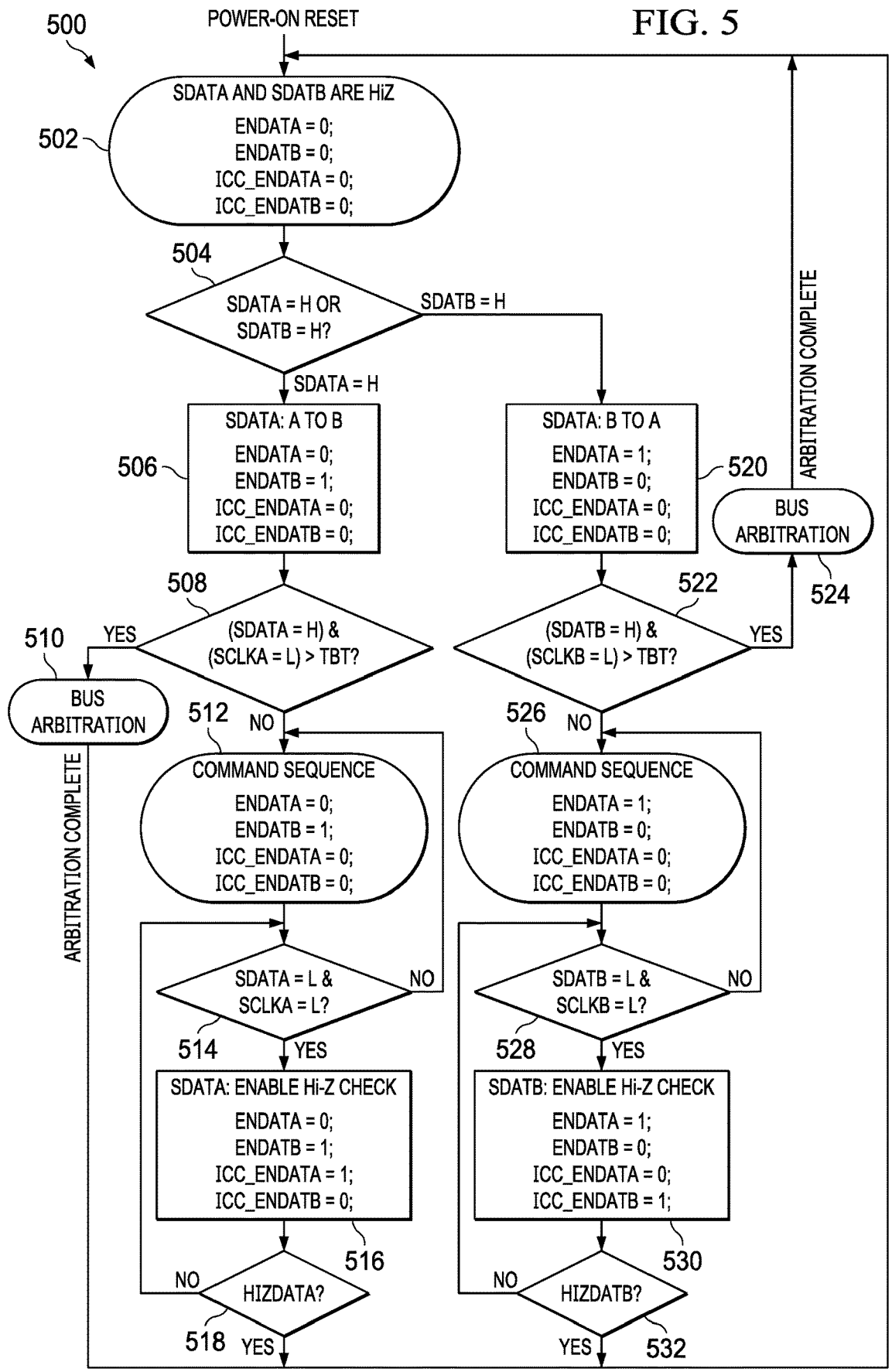
FIG. 5 shows another state diagram for the re-driver circuit of FIG. 2 in accordance with various examples.

The functionality of the controller 150 and the re-driver circuit 102 generally is explained further with respect to FIGS. 3-5. In one example, as explained above, the re-driver circuit 102 is utilized in an SPMI interface, where the bus 112, 116 and the bus 114, 118 comprise the two-wire bus of the SPMI interface. FIG. 3 shows a state diagram 300 that illustrates the functionality of the controller 150 and the re-driver circuit 102 with respect to facilitating level shifting and/or re-driving of clock signals (e.g., on the bus 112, 116) between devices 108 in the first voltage domain 104 and devices 110 in the second voltage domain 106. In an example, a device 108, 110 that is a master provides a clock signal that is used for communications to and from corresponding slave device(s). For example, when a device 108, 110 provides a clock signal to the re-driver circuit 102 (detected by the re-driver circuit 102 as a first signal edge), that device 108, 110 is presumed to be the master until the driven clock bus 112, 116 transitions to a high-impedance state. Thus, the re-driver circuit 102 continues to drive the first-detected clock signal from one voltage domain 104, 106 to the other until the driven clock bus 112, 116 transitions to a high-impedance state. FIG. 4 shows a timing diagram 400 that corresponds to this functionality. The timing diagram 400 includes waveforms representing the signals on the first clock bus 112 (SCLKA) and the second clock bus 116 (SCLKB); control signals for current to be injected by the current source 130 (ICC_ENCLKA) and the current source 132 (ICC_ENCLKB); and an enable signal for the first communication channel 137 (ENCLKB, which enables the driver 142 of the first communication channel 137) and for the second communication channel 143 (ENCLKA, which enables the driver 148 of the second communication channel 143).

Initially, as shown in portion 402 of FIG. 4 for example, upon a power on or reset event of a device encompassing the voltage domains 104, 106 and the re-driver circuit 102, the state diagram 300 begins in state 302. In state 302, both of the clock buses 112, 116 are in a high-impedance state (e.g., are not being driven by any device 108, 110). No device 108, 110 is driving the clock buses 112, 116, and thus neither the first communication channel 137 nor the second communication channel 143 of the re-driver circuit 102 is enabled, and thus the controller 150 does not assert ENCLKA or ENCLKB. Further, in state 302 it has been determined (e.g., due to a power on or reset event) that both of the clock buses 112, 116 are in a high-impedance state, and thus the controller 150 does not cause either current source 130, 132 to inject current, and thus ICC_ENCLKA and ICC_ENCLKB are also de-asserted.

Subsequently, during time region 408, controller 150 detects a first signal edge on the clock bus 112 and the state diagram 300 thus continues to state 304. For purposes of explanation, it is assumed that the first signal edge is first detected on the first clock bus 112 when SCLKA goes high or is asserted prior to SCLKB, and thus the state diagram 300 continues to state 306. In state 306, the controller 150 enables the first communication channel 137 by asserting ENCLKB (also in time region 408), which enables the driver 142 of the first communication channel 137. When enabled, the driver 142 level shifts and/or re-drives the clock signal received from the first clock bus 112 to the second clock bus 116. This is shown in portion 402 of FIG. 4 as a re-driving of the signal. The second communication channel 143 remains disabled (e.g., ENCLKA is de-asserted). As explained above, the delay element 140 in the first communication channel 137 provides the controller 150 with sufficient time to assert ENCLKB prior to the signal from the first port 152 that caused the state change (e.g., the first signal edge) arriving at the driver 142. This is reflected in the timing diagram 400, in which SCLKB is delayed from SCLKA.

Subsequently, the state diagram 300 proceeds to state 308 in which the first clock bus 112 (SCLKA) is monitored by the controller 150 to detect whether SCLKA is de-asserted. As explained above, in an example, the controller 150 monitors a comparator output, which is asserted when the signal on the first clock bus 112 goes low or is de-asserted. While SCLKA remains high or asserted, the state diagram 300 remains in states 306 and 308. However, when SCLKA goes low or is de-asserted, the state diagram 300 continues to state 310.

In state 310, the controller 150 samples an impedance at the first port 152, coupled to the first clock bus 112, as explained above. In particular, the controller 150 asserts ICC_ENCLKA to cause the current source 130 to inject current to the first port 152. This is reflected in the timing diagram 400, in which ICC_ENCLKA is asserted (e.g., as two pulses 410, 412) while SCLKA is de-asserted. The state diagram 300 continues in state 312, in which the controller 150 determines whether the first clock bus 112 is in a high-impedance state, for example, by monitoring the output of the comparator 134 as described above. For example, when the first clock bus 112 is being driven by a device 108, the injection of current to the first port 152 does not cause a voltage of the first clock bus 112 to rise above the reference voltage for the comparator 134, VBIASA. This is reflected in the timing diagram 400, in which the first assertion of ICC_ENCLKA does not cause the voltage of SCLKA to rise above VBIASA, because a device 108 is driving SCLKA low. In state 312, if the controller 150 determines that the first clock bus 112 is not in a high-impedance state (for example, controller 150 determines that HIZCLKA is not a high value), the state diagram 300 returns to state 308 and, depending on whether SCLKA is low or de-asserted, to one of states 306, 310 as described above.

However, when the first clock bus 112 is not being driven by a device 108, the injection of current to the first port 152 causes a voltage to be dropped across the pull-down resistor 120 that is greater than the reference voltage for the comparator 134, VBIASA (reflected at 406), which causes the output of the comparator 134 to be asserted. Thus, the controller 150 determines that the first clock bus 112 is in a high-impedance state in response to the output of the comparator 134 being asserted. This is reflected in the timing diagram 400, in which the second assertion of ICC_ENCLKA 412 (after SCLKA has transitioned to a high-impedance state, indicated by a dashed line) results in the voltage of SCLKA exceeding VBIASA at 406. In state 312, if the controller 150 determines that the first clock bus 112 is in a high-impedance state, the state diagram 300 returns to state 302 and the controller 150 disables the first communication channel 137 and waits to receive a first signal edge from a device 108, 110 in the first or second voltage domains 104, 106, respectively.

Referring back to state 304, in another example, the controller 150 detects the first signal edge from the second clock bus 116 when SCLKB goes high or is asserted prior to SCLKA. This is reflected during time region 413 of portion 404 of the timing diagram 400. In this case, the state diagram 300 continues to state 314. States 314, 316, 318, and 320 are generally similar to the above-described states 306, 308, 310, 312, but in the opposite direction of communication travel. For example, in state 314, the controller 150 enables the second communication channel 143 by asserting ENCLKA (also during time region 413), which enables the driver 148 of the second communication channel 143. When enabled, the driver 148 level shifts and/or re-drives the clock signal received from the second clock bus 116 to the first clock bus 112. The example of portion 404 of timing diagram 400 illustrates a level shifting of the clock signal from a higher voltage level to a lower voltage level. The first communication channel 137 remains disabled (e.g., ENCLKB is de-asserted). As explained above, the delay element 146 in the second communication channel 143 provides the controller 150 with sufficient time to assert ENCLKA prior to the signal from the second port 154 that caused the state change (e.g., the first signal edge) arriving at the driver 148. This is reflected in portion 404 of the timing diagram 400, in which SCLKA is delayed from SCLKB.

Subsequently, the state diagram 300 proceeds to state 316 in which the second clock bus 116 (SCLKB) is monitored by the controller 150 to detect whether SCLKB is de-asserted. As explained above, in an example, the controller 150 monitors a comparator output, which is asserted when the signal on the second clock bus 116 goes low or is de-asserted. While SCLKB remains high or asserted, the state diagram 300 remains in states 314 and 316. However, when SCLKB goes low or is de-asserted, the state diagram 300 continues to state 318.

In state 318, the controller 150 samples an impedance at the second port 154, coupled to the second clock bus 116, as explained above. In particular, the controller 150 asserts ICC_ENCLKB to cause the current source 132 to inject current to the second port 154. This is reflected in the timing diagram 400, in which ICC_ENCLKB is asserted while SCLKB is de-asserted (e.g., as two pulses 414, 416). The state diagram 300 continues in state 320, in which the controller 150 determines whether the second clock bus 116 is in a high-impedance state, for example by monitoring the output of the comparator 136 as described above. For example, when the second clock bus 116 is being driven by a device 110, the injection of current to the second port 154 does not cause a voltage of the second clock bus 116 to rise above the reference voltage for the comparator 136, VBIASB. This is reflected in the timing diagram 400 at 418, in which the assertion 414 of ICC_ENCLKB does not cause the voltage of SCLKB to rise above VBIASB, because a device 110 is driving SCLKB low. In state 320, if the controller 150 determines that the second clock bus 116 is not in a high-impedance state, the state diagram 300 returns to state 316 and, depending on whether SCLKB is low or de-asserted, to one of states 314, 318 as described above.

However, when the second clock bus 116 is not being driven by a device 110, the injection of current to the second port 154 causes a voltage to be dropped across the pull-down resistor 124 that is greater than the reference voltage for the comparator 136, VBIASB, which causes the output of the comparator 136 to be asserted. Thus, the controller 150 determines that the second clock bus 116 is in a high-impedance state in response to the output of the comparator 136 being asserted. This is reflected in the timing diagram 400 at point 420. In state 320, if the controller 150 determines that the second clock bus 116 is in a high-impedance state, the state diagram 300 returns to state 302 and the controller 150 disables the second communication channel 143 and waits to receive a first signal edge from a device 108, 110 in the first or second voltage domains 104, 106, respectively.

As explained above, the re-driver circuit 102 thus monitors both sides of the clock bus (e.g., first clock bus 112 and second clock bus 116) and detects the direction of the communication signal received, by detecting the first signal edge to arrive from a device 108, 110 in the first or second voltage domains 104, 106, respectively. The re-driver circuit 102 performs level shifting and/or re-driving of the communication signal in the direction of data transmission. At the same time, the re-driver circuit 102 prevents data transmission in the opposite direction, by only enabling one of the first communication channel 137 and the second communication channel 143 at a time, enabling bidirectional, half-duplex communication between devices 108, 110 in the first and second voltage domains 104, 106, respectively.

FIG. 5 shows a state diagram 500 that illustrates the functionality of the controller 150 and the re-driver circuit 102 with respect to facilitating level shifting and/or re-driving of data signals (e.g., on the data bus 114, 118) between devices 108 in the first voltage domain 104 and devices 110 in the second voltage domain 106. In an example, a device 108, 110 that is a master provides a clock signal (as described above) along with a data signal, which are used for communications to and from corresponding slave device(s). However, unlike the clock signal, which is always provided by the master, in bidirectional communications interfaces the master also expects to receive data from one or more slave(s). Further, although the re-driver circuit 102 does not itself perform any bus arbitration functionality, the re-driver circuit 102 is configured to allow the devices 108, 110 to perform such bus arbitration while still facilitating bidirectional, half-duplex communication between the devices 108, 110 in different voltage domains 104, 106.

As above with respect to FIG. 3, upon a power on or reset event of a device encompassing the voltage domains 104, 106 and the re-driver circuit 102, the state diagram 500 begins in state 502. In state 502, both of the data buses 114, 118 are in a high-impedance state (e.g., are not being driven by any device 108, 110). No device 108, 110 is driving the data buses 114, 118, and thus neither the third communication channel 167 nor the fourth communication channel 173 of the re-driver circuit 102 is enabled, and thus the controller 150 does not assert ENDATA or ENDATB. Further, in state 502 it has been determined (e.g., due to a power on or reset event) that both of the data buses 114, 118 are in a high-impedance state, and thus the controller 150 does not cause either current source 160, 162 to inject current, and thus ICC_ENDATA and ICC_ENDATB are also de-asserted.

Subsequently, the controller 150 detects a first signal edge on one of the data buses 114, 118 and the state diagram 500 thus continues to state 504. For purposes of explanation, it is assumed that the first signal edge is first detected on the first data bus 114 when SDATA goes high or is asserted prior to SDATB, and thus the state diagram 500 continues to state 506. In state 506, the controller 150 enables the third communication channel 167 by asserting ENDATB, which enables the driver 172 of the third communication channel 167. When enabled, the driver 172 level shifts and/or re-drives the data signal received from the first data bus 114 to the second data bus 118. The fourth communication channel 173 remains disabled (e.g., ENDATA is de-asserted). As explained above, the delay element 170 in the third communication channel 167 provides the controller 150 with sufficient time to assert ENDATB prior to the signal from the third port 156 that caused the state change (e.g., the first signal edge) arriving at the driver 172. The effect of the delay element 170 is similar to that shown in FIG. 4, and described above.

Subsequently, the state diagram 500 proceeds to state 508, in which the controller 150 determines whether a bus arbitration start condition has occurred. As explained above, although the re-driver circuit 102 does not itself perform any bus arbitration functionality, the re-driver circuit 102 is configured to allow the devices 108, 110 to perform such bus arbitration. In an example in which the re-driver circuit 102 is utilized in an SPMI interface, the bus arbitration start condition is indicated by the data signal (e.g., received from the first data bus 114) remaining asserted while the clock signal (e.g., received from the first clock bus 112) remains de-asserted for at least a bus turnaround time ($T_{BT}$). In an example, the value of $T_{BT}$ is determined by an SPMI specification. The occurrence of this bus arbitration start condition indicates to the controller 150 that bus arbitration is to take place between devices 108, 110, and thus the state diagram 500 proceeds to block 510.

The controller 150 is configured to facilitate various bus arbitration schemes, for example, as they are defined in one or more specifications for the interface in which the re-driver circuit 102 facilitates communications. In one example, the bus arbitration scheme that occurs in state 510 continues for a predetermined duration (e.g., number of clock cycles). Thus, in state 510 the controller 150 facilitates the bus arbitration scheme (e.g., by enabling and disabling the third and fourth communication channels 167, 173 accordingly) and, when the predetermined duration has elapsed, the bus arbitration is complete and the state diagram proceeds back to state 502, explained above.

In state 508, if the controller 150 determines that the bus arbitration start condition has not occurred, then the state diagram 500 proceeds to block 512. For example, if SDATA is de-asserted, SCLKA is asserted, or SCLKA is de-asserted for less than $T_{BT}$, then the bus arbitration start condition has not occurred. In state 512, the controller 150 continues to enable the third communication channel 167 by asserting ENDATB, while continuing to disable the fourth communication channel 173 by de-asserting ENDATA. From state 512, the state diagram 500 proceeds to state 514, in which the first data bus 114 (SDATA) and the first clock bus 112 (SCLKA) are monitored by the controller 150 to detect whether SDATA and SCLKA are both de-asserted. As explained above, in an example the controller 150 monitors comparator outputs, one of which is asserted when the signal on the first clock bus 112 goes low or is de-asserted, and another of which is asserted when the signal on the first data bus 114 goes low or is de-asserted. While SDATA and/or SCLKA remain high or asserted, the state diagram 500 remains in states 512 and 514. However, when SDATA and SCLKA go low or are de-asserted, the state diagram 500 continues to state 516.

In state 516, the controller 150 samples an impedance at the third port 156, coupled to the first data bus 114, as explained above. In particular, the comparator 150 asserts ICC_ENDATA to cause the current source 160 to inject current to the third port 156. The state diagram 500 continues in state 518, in which the controller 150 determines whether the first data bus 114 is in a high-impedance state, for example, by monitoring the output of the comparator 164 (HIZDATA) as described above. For example, when the first data bus 114 is being driven by a device 108, the injection of current to the third port 156 does not cause a voltage of the first data bus 114 to rise above the reference voltage for the comparator 164, VBIASA. In state 518, if the controller 150 determines that the first data bus 114 is not in a high-impedance state, the state diagram 500 returns to state 514 and, depending on whether SDATA and SCLKA are low or de-asserted, to one of states 512, 516 as described above.

However, when the first data bus 114 is not being driven by a device 108, the injection of current to the third port 156 causes a voltage to be dropped across the pull-down resistor 122 that is greater than the reference voltage for the comparator 164, VBIASA, which causes the output of the comparator 164 to be asserted. Thus, the controller 150 determines that the first data bus 114 is in a high-impedance state in response to the output of the comparator 164 being asserted. In state 518, if the controller 150 determines that the first data bus 114 is in a high-impedance state, the state diagram 500 returns to state 502 and the controller 150 disables the third communication channel 167 and waits to receive a first signal edge from a device 108, 110 in the first or second voltage domains 104, 106, respectively.

Referring back to state 504, in another example, the controller 150 detects the first signal edge from the second data bus 118 when SDATB goes high or is asserted prior to SDATA. In this case, the state diagram 500 continues to state 520. States 520, 522, 524, 526, 528, 530, and 532 are generally similar to the above-described states 506, 508, 510, 512, 514, 516, and 518, but in the opposite direction of communication travel. For example, in state 520, the controller 150 enables the fourth communication channel 173 by asserting ENDATA, which enables the driver 178 of the fourth communication channel 173. When enabled, the driver 178 level shifts and/or re-drives the data signal received from the second data bus 118 to the first data bus 114. The third communication channel 167 remains disabled (e.g., ENDATB is de-asserted). As explained above, the delay element 176 in the fourth communication channel 173 provides the controller 150 with sufficient time to assert ENDATA prior to the signal from the fourth port 158 that caused the state change (e.g., the first signal edge) arriving at the driver 178.

Subsequently, the state diagram 500 proceeds to state 522 in which the controller 150 determines whether a bus arbitration start condition has occurred. As explained above, in one example, the bus arbitration start condition is indicated by the data signal (e.g., received from the second data bus 118) remaining asserted while the clock signal (e.g., received from the second clock bus 116) remains de-asserted for at least $T_{BT}$. The occurrence of this bus arbitration start condition indicates to the controller 150 that bus arbitration is to take place between devices 108, 110, and thus the state diagram 500 proceeds to block 524. As explained above, in state 524 the controller 150 facilitates the bus arbitration scheme (e.g., by enabling and disabling the third and fourth communication channels 167, 173 accordingly) and, when the predetermined duration has elapsed, the bus arbitration is complete and the state diagram proceeds back to state 502, explained above.

In state 522, if the controller 150 determines that the bus arbitration start condition has not occurred, then the state diagram 500 proceeds to block 526. For example, if SDATB is de-asserted, SCLKB is asserted, or SCLKB is de-asserted for less than $T_{BT}$, then the bus arbitration start condition has not occurred. In state 526, the controller 150 continues to enable the fourth communication channel 173 by asserting ENDATA, while continuing to disable the third communication channel 167 by de-asserting ENDATB. From state 526, the state diagram 500 proceeds to state 528, in which the second data bus 118 (SDATB) and the second clock bus 116 (SCLKB) are monitored by the controller 150 to detect whether SDATB and SCLKB are both de-asserted. As explained above, in an example the controller 150 monitors comparator outputs, one of which is asserted when the signal on the second clock bus 116 goes low or is de-asserted, and another of which is asserted when the signal on the second data bus 118 goes low or is de-asserted. While SDATB and/or SCLKB remain high or asserted, the state diagram 500 remains in states 526 and 528. However, when SDATB and SCLKB go low or are de-asserted, the state diagram 500 continues to state 530.

In state 530, the controller 150 samples an impedance at the fourth port 158, coupled to the second data bus 118, as explained above. In particular, the controller 150 asserts ICC_ENDATB to cause the current source 162 to inject current to the fourth port 158. The state diagram 500 continues in state 532, in which the controller 150 determines whether the second data bus 118 is in a high-impedance state, for example by monitoring the output of the comparator 166 (HIZDATB) as described above. For example, when the second data bus 118 is being driven by a device 110, the injection of current to the fourth port 158 does not cause a voltage of the second data bus 118 to rise above the reference voltage for the comparator 166, VBIASB. In state 532, if the controller 150 determines that the second data bus 118 is not in a high-impedance state (HIZDATB is not high), the state diagram 500 returns to state 528 and, depending on whether SDATB and SCLKB are low or de-asserted, to one of states 526, 530 as described above.

However, when the second data bus 118 is not being driven by a device 110, the injection of current to the fourth port 158 causes a voltage to be dropped across the pull-down resistor 126 that is greater than the reference voltage for the comparator 166, VBIASB, which causes the output of the comparator 166 to be asserted. Thus, the controller 150 determines that the second data bus 118 is in a high-impedance state in response to the output of the comparator 166 being asserted. In state 532, if the controller 150 determines that the second data bus 118 is in a high-impedance state (HIZDATB is high), the state diagram 500 returns to state 502 and the controller 150 disables the fourth communication channel 173 and waits to receive a first signal edge from a device 108, 110 in the first or second voltage domains 104, 106, respectively.

As explained above, the re-driver circuit 102 thus monitors both sides of the data bus (e.g., first data bus 114 and second data bus 118) and detects the direction of the communication signal received, by detecting the first signal edge to arrive from a device 108, 110 in the first or second voltage domains 104, 106, respectively. The re-driver circuit 102 performs level shifting and/or re-driving of the communication signal in the direction of data transmission. Further, the re-driver circuit 102 facilitates a bus arbitration scheme between devices 108, 110 by detecting a bus arbitration start condition, allowing bus arbitration to occur and, when complete, continuing to facilitate data transmissions between devices 108, 110. While facilitating data transmission in one direction, the re-driver circuit 102 also prevents data transmission in the opposite direction, by only enabling one of the third communication channel 167 and the fourth communication channel 173 at a time. Thus, the re-driver circuit 102 also enables bidirectional, half-duplex data communication between devices 108, 110 in the first and second voltage domains 104, 106, respectively.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "approximately" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:
1. A re-driver circuit, comprising:
a first port configured to couple to a first device by a first bus;
a second port configured to couple to a second device by a second bus;
a first communication channel having an input coupled to the first port and an output coupled to the second port, the first communication channel configured to re-drive an input signal and output the re-driven input signal;
a second communication channel having an input coupled to the second port and an output coupled to the first port, the second communication channel configured to re-drive an input signal and output the re-driven input signal; and
a controller configured to:
enable the first communication channel and disable the second communication channel in response to detecting a first signal edge at the first port;
enable the second communication channel and disable the first communication channel in response to detecting a first signal edge at the second port;
sample an impedance at the first port in response to the input signal received at the first port being de-asserted while the first communication channel is enabled; and
sample an impedance at the second port in response to the input signal received at the second port being de-asserted while the second communication channel is enabled.

2. The re-driver circuit of claim 1, wherein:
the first device is in a first voltage domain;
the second device is in a second voltage domain;
the first communication channel is configured to level shift the input signal received from the first port from the first voltage domain to the second voltage domain; and
the second communication channel is configured to level shift the input signal received from the second port from the second voltage domain to the first voltage domain.

3. The re-driver circuit of claim 1, wherein:
the first communication channel comprises:
a first receiver having an input coupled to the first port and an output;
a first delay element having an input coupled to the output of the first receiver and an output; and
a first driver having an input coupled to the output of the first delay element and an output coupled to the second port; and
the second communication channel comprises:
a second receiver having an input coupled to the second port and an output;
a second delay element having an input coupled to the output of the second receiver and an output; and
a second driver having an input coupled to the output of the second delay element and an output coupled to the first port.

4. The re-driver circuit of claim 1, further comprising:
a first current source coupled to the first port;
a first comparator comprising:
a non-inverting input coupled to the first port; and
an inverting input coupled to a first reference voltage source;
a second current source coupled to the second port; and
a second comparator comprising:
a non-inverting input coupled to the second port; and
an inverting input coupled to a second reference voltage source;
wherein the first bus has an impedance and is coupled to a first pull-down resistor, the first pull-down resistor is coupled to a ground node; and
wherein the second bus has an impedance and is coupled to a second pull-down resistor, the second pull-down resistor is coupled to the ground node.

5. The re-driver circuit of claim 4, wherein:
when the controller samples the impedance at the first port, the controller is configured to:
cause the first current source to inject a current to the first port; and
monitor an output of the first comparator;
when the controller samples the impedance at the second port, the controller is configured to:
cause the second current source to inject a current to the second port; and
monitor an output of the second comparator;

the output of the first comparator being asserted indicates a high-impedance state at the first port and, in response, the controller is configured to disable the first communication channel; and the output of the second comparator being asserted indicates a high-impedance state at the second port and, in response, the controller is configured to disable the second communication channel.

6. The re-driver circuit of claim 1, wherein the controller is further configured to:

facilitate a bus arbitration between the first device and the second device in response to a bus arbitration start condition being detected at the first port while the first communication channel is enabled, or the bus arbitration start condition being detected at the second port while the second communication channel is enabled; and disable the first and second communication channels in response to the bus arbitration being complete.

7. A re-driver circuit, comprising:
a first port configured to couple to a first device by a first clock bus;
a second port configured to couple to a second device by a second clock bus;
a third port configured to couple to the first device by a first data bus;
a fourth port configured to couple to the second device by a second data bus;
a first communication channel configured to re-drive an input clock signal received from the first port to the second port as an output clock signal;
a second communication channel configured to re-drive an input clock signal received from the second port to the first port as an output clock signal;
a third communication channel configured to re-drive an input data signal received from the third port to the fourth port as an output data signal;
a fourth communication channel configured to re-drive an input data signal received from the fourth port to the third port as an output data signal; and
a controller configured to:
  enable the first communication channel and disable the second communication channel in response to detecting a start of clock signal edge at the first port;
  enable the second communication channel and disable the first communication channel in response to detecting a start of clock signal edge at the second port;
  enable the third channel and disable the fourth channel in response to detecting a start of data signal edge at the third port;
  enable the fourth communication channel and disable the third communication channel in response to detecting a start of data signal edge at the fourth port;
  sample an impedance at the first port in response to the input clock signal received at the first port being de-asserted while the first communication channel is enabled;
  sample an impedance at the second port in response to the input clock signal received at the second port being de-asserted while the second communication channel is enabled;
  sample an impedance at the third port in response to the input data signal received at the third port being de-asserted while the third communication channel is enabled; and
  sample an impedance at the fourth port in response to the input data signal received at the fourth port being de-asserted while the fourth communication channel is enabled.

8. The re-driver circuit of claim 7, wherein:
the first device is in a first voltage domain;
the second device is in a second voltage domain;
the first communication channel is configured to level shift the input clock signal received from the first port from the first voltage domain to the second voltage domain;
the second communication channel is configured to level shift the input clock signal received from the second port from the second voltage domain to the first voltage domain;
the third communication channel is configured to level shift the input data signal received from the third port from the first voltage domain to the second voltage domain; and
the fourth communication channel is configured to level shift the input data signal received from the fourth port from the second voltage domain to the first voltage domain.

9. The re-driver circuit of claim 7, wherein:
the first communication channel comprises:
  a first receiver to receive the input clock signal from the first port;
  a first delay element to receive a signal from the first receiver; and
  a first driver to receive a signal from the first delay element and drive the output clock signal to the second port;
the second communication channel comprises:
  a second receiver to receive the input clock signal from the second port;
  a second delay element to receive a signal from the second receiver; and
  a second driver to receive a signal from the second delay element and drive the output clock signal to the first port;
the third communication channel comprises:
  a third receiver to receive the input data signal from the third port;
  a third delay element to receive a signal from the third receiver; and
  a third driver to receive a signal from the third delay element and drive the output data signal to the fourth port; and
the fourth communication channel comprises:
  a fourth receiver to receive the input data signal from the fourth port;
  a fourth delay element to receive a signal from the fourth receiver; and
  a fourth driver to receive a signal from the fourth delay element and drive the output data signal to the third port.

10. The re-driver circuit of claim 7, further comprising:
a first current source coupled to the first port;
a first comparator comprising:
  a non-inverting input coupled to the first port; and
  an inverting input coupled to a first reference voltage source;
a second current source coupled to the second port; and
a second comparator comprising:
  a non-inverting input coupled to the second port; and
  an inverting input coupled to a second reference voltage source;

a third current source coupled to the third port;
a third comparator comprising:
    a non-inverting input coupled to the third port; and
    an inverting input coupled to a third reference voltage source;
a fourth current source coupled to the fourth port;
a fourth comparator comprising:
    a non-inverting input coupled to the fourth port; and
    an inverting input coupled to a fourth reference voltage source;
wherein the first clock bus is coupled to a first pull-down resistor, the first pull-down resistor is coupled to a ground node;
wherein the second clock bus is coupled to a second pull-down resistor, the second pull-down resistor is coupled to the ground node;
wherein the first data bus is coupled to a third pull-down resistor, the third pull-down resistor is coupled to the ground node; and
wherein the second data bus is coupled to a fourth pull-down resistor, the fourth pull-down resistor is coupled to the ground node.

11. The re-driver circuit of claim 10, wherein:
when the controller samples the impedance at the first port, the controller is configured to:
    cause the first current source to inject a current to the first port; and
    monitor an output of the first comparator;
when the controller samples the impedance at the second port, the controller is configured to:
    cause the second current source to inject a current to the second port; and
    monitor an output of the second comparator;
when the controller samples the impedance at the third port, the controller is configured to:
    cause the third current source to inject a current to the third port; and
    monitor an output of the third comparator;
when the controller samples the impedance at the fourth port, the controller is configured to:
    cause the fourth current source to inject a current to the fourth port; and
    monitor an output of the fourth comparator;
the output of the first comparator being asserted indicates a high-impedance state at the first port and, in response, the controller is configured to disable the first communication channel;
the output of the second comparator being asserted indicates a high-impedance state at the second port and, in response, the controller is configured to disable the second communication channel;
the output of the third comparator being asserted indicates a high-impedance state at the third port and, in response, the controller is configured to disable the third communication channel; and
the output of the fourth comparator being asserted indicates a high-impedance state at the fourth port and, in response, the controller is configured to disable the fourth communication channel.

12. The re-driver circuit of claim 7, wherein the controller is further configured to:
facilitate a bus arbitration between the first device and the second device in response to a bus arbitration start condition being detected at the first port and the third port while the first and third communication channels are enabled, or the bus arbitration start condition being detected at the second port and the fourth port while the second and fourth communication channels are enabled; and
disable the third and fourth communication channels in response to the bus arbitration being complete.

13. The re-driver circuit of claim 12, wherein:
the bus arbitration start condition detected at the first port and the third port comprises the input data signal received at the third port being asserted while the input clock signal received at the first port is de-asserted for at least a bus turnaround time; and
the bus arbitration start condition detected at the second port and the fourth port comprises the input data signal received at the fourth port being asserted while the input clock signal received at the second port is de-asserted for at least the bus turnaround time.

14. A method, comprising:
detecting a first signal edge at a first port configured to couple to a first device by a first bus, or detecting a first signal edge at a second port configured to couple to a second device by a second bus;
in response to detecting the first signal edge at the first port:
    enabling a first communication channel configured to re-drive an input signal received from the first port to a second port as an output signal; and
    disabling a second communication channel configured to re-drive an input signal received from the second port to the first port as an output signal;
in response to detecting the first signal edge at the second port:
    enabling the second communication channel; and
    disabling the first communication channel;
sampling an impedance at the first port in response to the input signal received at the first port being de-asserted while the first communication channel is enabled; and
sampling an impedance at the second port in response to the input signal received at the second port being de-asserted while the second communication channel is enabled.

15. The method of claim 14, wherein:
the first device is in a first voltage domain;
the second device is in a second voltage domain; and
the method further comprises:
    level shifting the input signal received from the first port from the first voltage domain to the second voltage domain when the first communication channel is enabled; and
    level shifting the input signal received from the second port from the second voltage domain to the first voltage domain when the second communication channel is enabled.

16. The method of claim 14, wherein:
a first current source is coupled to the first port;
a first comparator includes a non-inverting input coupled to the first port and an inverting input coupled to a first reference voltage source;
a second current source is coupled to the second port;
a second comparator includes a non-inverting input coupled to the second port and an inverting input coupled to a second reference voltage source;
the first bus is coupled to a first pull-down resistor, the first pull-down resistor is coupled to a ground node; and
the second bus is coupled to a second pull-down resistor, the second pull-down resistor is coupled to the ground node.

17. The method of claim 16, wherein:
sampling the impedance at the first port further comprises:
- causing the first current source to inject a current to the first port; and
- monitoring an output of the first comparator;

sampling the impedance at the second port further comprises:
- causing the second current source to inject a current to the second port; and
- monitoring an output of the second comparator;

the method further comprises:
- disabling the first communication channel in response to the output of the first comparator being asserted indicating a high-impedance state at the first port; and
- disabling the second communication channel in response to the output of the second comparator being asserted indicating a high-impedance state at the second port.

18. The method of claim 14, further comprising:
- facilitating a bus arbitration between the first device and the second device in response to detecting a bus arbitration start condition at the first port while the first communication channel is enabled, or to detecting the bus arbitration start condition at the second port while the second communication channel is enabled; and
- disabling the first and second communication channels in response to the bus arbitration being complete.

* * * * *